United States Patent
Standaert et al.

(10) Patent No.: US 8,569,125 B2
(45) Date of Patent: Oct. 29, 2013

(54) FINFET WITH IMPROVED GATE PLANARITY

(75) Inventors: Theodorus Eduardus Standaert, Hopewell Junction, NY (US); Kangguo Cheng, Albany, NY (US); Balasubramanian S. Haran, Albany, NY (US); Shom Ponoth, Albany, NY (US); Soon-Cheon Seo, Hopewell Junction, NY (US); Tenko Yamashita, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 13/307,931

(22) Filed: Nov. 30, 2011

(65) Prior Publication Data
US 2013/0134513 A1    May 30, 2013

(51) Int. Cl.
*H01L 21/336* (2006.01)

(52) U.S. Cl.
USPC ............ 438/197; 438/585; 257/E21.409

(58) Field of Classification Search
USPC ................................. 438/197, 585
See application file for complete search history.

(56) References Cited

U.S. PATENT DOCUMENTS

| | | | |
|---|---|---|---|
| 6,483,156 B1 * | 11/2002 | Adkisson et al. | 257/401 |
| 6,894,326 B2 | 5/2005 | Nowak | |
| 6,987,289 B2 | 1/2006 | Nowak | |
| 7,709,893 B2 | 5/2010 | Bauer et al. | |
| 7,795,669 B2 | 9/2010 | Georgakos et al. | |
| 2005/0124101 A1* | 6/2005 | Beintner | 438/197 |
| 2007/0045736 A1* | 3/2007 | Yagishita | 257/347 |
| 2008/0315309 A1 | 12/2008 | Chang et al. | |
| 2010/0015778 A1 | 1/2010 | Lin et al. | |
| 2011/0284967 A1 | 11/2011 | Cheng et al. | |
| 2013/0134513 A1* | 5/2013 | Standaert et al. | 257/347 |

FOREIGN PATENT DOCUMENTS

DE    112010004324 T5    11/2012
WO    WO/2011/149587 A1    1/2011

* cited by examiner

*Primary Examiner* — Lex Malsawma
(74) *Attorney, Agent, or Firm* — Joseph P. Abate; Howard M. Cohn

(57) ABSTRACT

A FinFET with improved gate planarity and method of fabrication is disclosed. The gate is disposed on a pattern of fins prior to removing any unwanted fins. Lithographic techniques or etching techniques or a combination of both may be used to remove the unwanted fins. All or some of the remaining fins may be merged.

15 Claims, 10 Drawing Sheets

FINFET WITH IMPROVED GATE PLANARITY

FIELD OF THE INVENTION

The present invention generally relates to semiconductors, and more particularly, to the fin type transistors known as FinFETs and to an improved manufacturing process and FinFET structure.

BACKGROUND OF THE INVENTION

As the need to decrease the size of transistors continues, new and smaller types of transistors are created. One recent advance in transistor technology is the introduction of fin type field effect transistors that are known as FinFETs. A FinFET structure includes a center fin that has a channel along its surfaces, and source and drains at the ends of the fin structure. A gate conductor covers the channel portion.

While FinFETs structures reduce the size of transistor-based devices, it is still important to continue to reduce the size of FinFET transistors. However, although FinFET devices are very attractive when considering their excellent short channel control, coping with the 3-D nature of these devices in manufacturing presents significant challenges. It is therefore desirable to have improved FinFET structures and methods of fabrication.

SUMMARY

In one embodiment, a method of fabricating a FinFET is disclosed. The method comprises forming a pattern of fins. Each fin comprises a fin hardmask layer disposed on it. A gate layer is disposed over the pattern of fins. Subsequent steps include depositing a gate hardmask layer over the gate layer; removing a portion of gate hardmask layer and gate layer, thereby exposing the pattern of fins; depositing an etch-resistant layer over a first subset of fins from the pattern of fins; removing a second subset of the fins from the pattern of fins with an etch; and merging at least some of the first subset of fins.

In another embodiment, a method of fabricating a FinFET is disclosed. The method comprises forming a pattern of fins, in which each fin comprises a fin hardmask layer disposed on it. Subsequent steps include removing the fin hardmask layer from a first subset of fins from the pattern of fins; depositing a gate layer over the pattern of fins; depositing a gate hardmask layer over the gate layer; removing a portion of the gate layer and the first subset of fins in a single process step, in which a second subset of fins from the pattern of fins is preserved.

In another embodiment, a FinFET structure is provided. The FinFET structure comprises a dielectric substrate; a plurality of design fins disposed on the dielectric substrate; a plurality of finlets disposed on the dielectric substrate; and a gate layer disposed over a portion of each design fin and over each of the plurality of finlets.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIGS. 1A-1D show a prior art FinFET fabrication process.

FIGS. 2A-2G show a FinFET fabrication process in accordance with an embodiment of the present invention.

FIGS. 3A-3C show a FinFET fabrication process in accordance with an alternative embodiment of the present invention.

FIG. 4 shows a step in a FinFET fabrication process in accordance with another embodiment of the present invention.

FIG. 5 is a flowchart indicating process steps for a FinFET fabrication process in accordance with an embodiment of the present invention.

FIG. 6 is a flowchart indicating process steps for a FinFET fabrication process in accordance with an alternative embodiment of the present invention.

FIG. 7 shows a block diagram of an exemplary design flow.

DETAILED DESCRIPTION

In a conventional FinFET process flow, the fins and the active area are fully formed before any of the gate process steps take place. In embodiments of the present invention, the fins are formed first in a uniform fashion across the chip. In some instances, the pitch may be fixed. In other embodiments, the pitch may vary. In one embodiment, one portion of the chip (e.g. logic) has a first fin pitch (e.g. 40 nanometers), and a second portion of the chip (e.g. the SRAM) is at a different pitch (e.g. 44 nanometers).

Next, the gate layer is disposed over the fins. In case of a replacement gate flow, the gate layer could be a sacrificial film which is removed at a later stage in the process flow to gain access to the channel and engineer the workfunction of the device by depositing and etching various films known in the art. In case of a gate-first flow, the gate layer would include the final films that set the workfunction of the device. In addition to these two flows, there are also many hybrid options in which the gate layer comprises a set of final and sacrificial films.

The removal of sacrificial fins takes place after the gates have been formed. This provides an important advantage in that it minimizes the gate height variation. This improves device reliability and performance, and also results in less complication in subsequent processing steps.

Figure 1A:
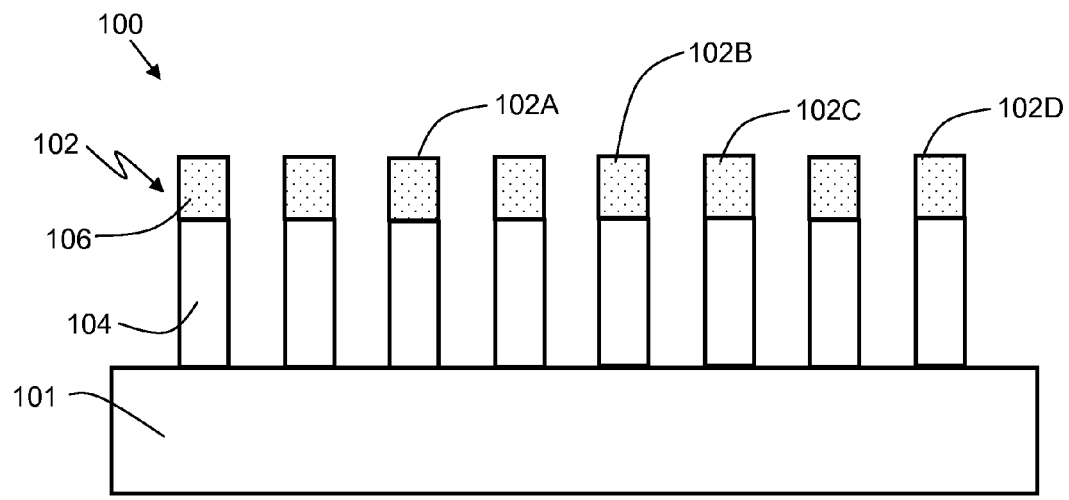

For the purpose of providing context, the prior art FinFET process is briefly described in FIGS. 1A-1D. FIG. 1A shows a side view of a FinFET structure 100. A plurality of fins, shown generally as 102, are disposed on a dielectric substrate 101. Each fin is comprised of a silicon portion 104, and a hardmask portion 106. To complete fabrication of the FinFET, a portion of the fins are removed, while the remaining fins are kept. The particular FinFET design determines which fins are removed and which are kept. For the purposes of this disclosure, a fin that is to be kept is referred to as a "design fin," and a fin that is to be removed is referred to as a "sacrificial fin." In the example of FIGS. 1A-1D, fins 102A, 102B, and 102C are sacrificial fins, and the remaining fins, including fin 102D, are design fins. Hence, the total fin pattern is divided into two subsets; design fins which are kept and sacrificial fins which get removed.

Figure 1B:
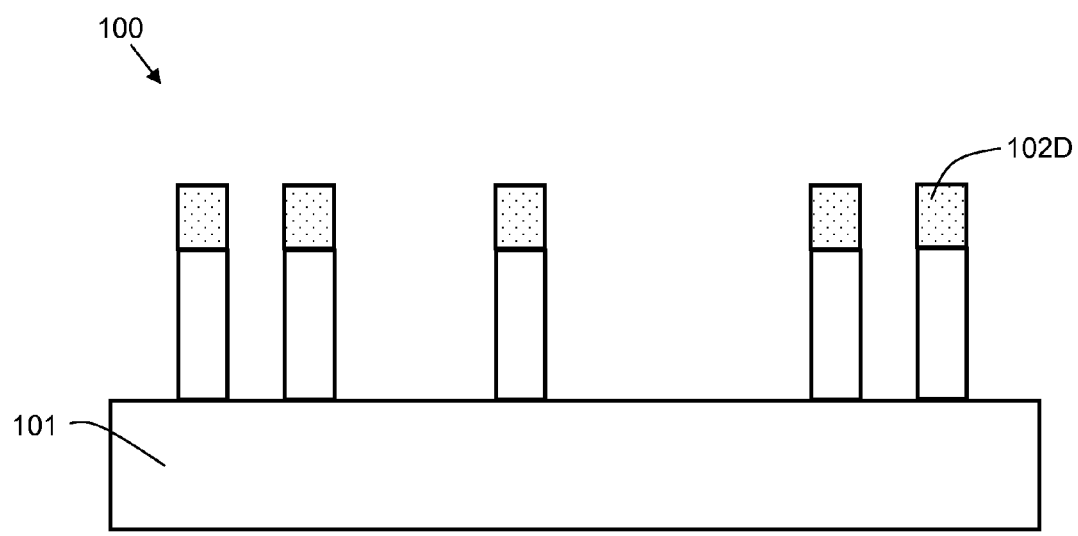

In FIG. 1B, the sacrificial fins are removed (compare with 102A, 102B, and 102C of FIG. 1A), while the design fins (indicated generally as 102D) remain. The removal of sacrificial fins may be performed with a combination of lithography and etching, as is known in the art.

Figure 1C:
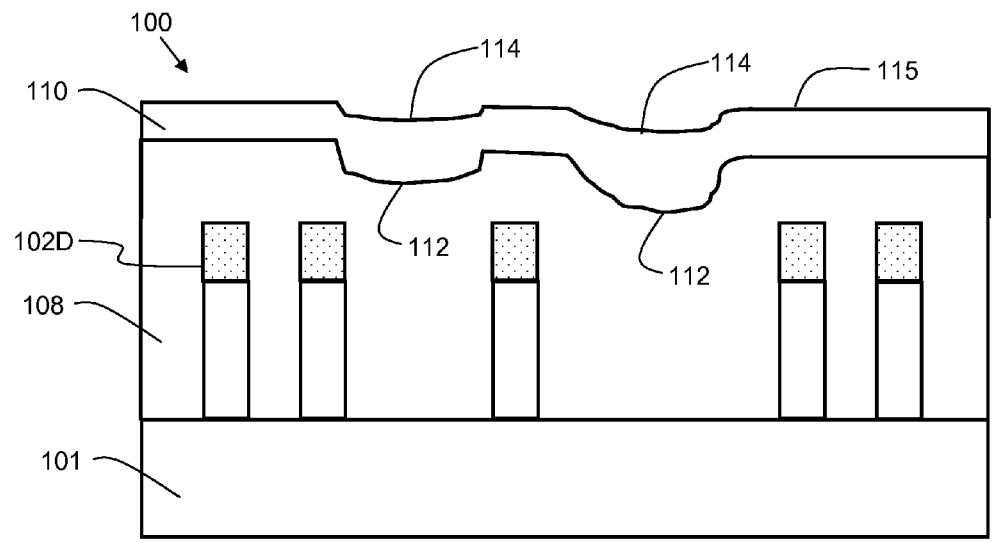

In FIG. 1C, a gate layer 108 is disposed over the design fins 102D. A gate hardmask layer 110 is then disposed over gate layer 108. In the regions where sacrificial fins were previously removed, the gate layer 108 has uneven areas 112. Consequently, the surface 115 of gate hardmask 110 also has corresponding uneven areas 114. These uneven areas are undesirable because they can cause complications in subsequent processing steps.

Figure 1D:
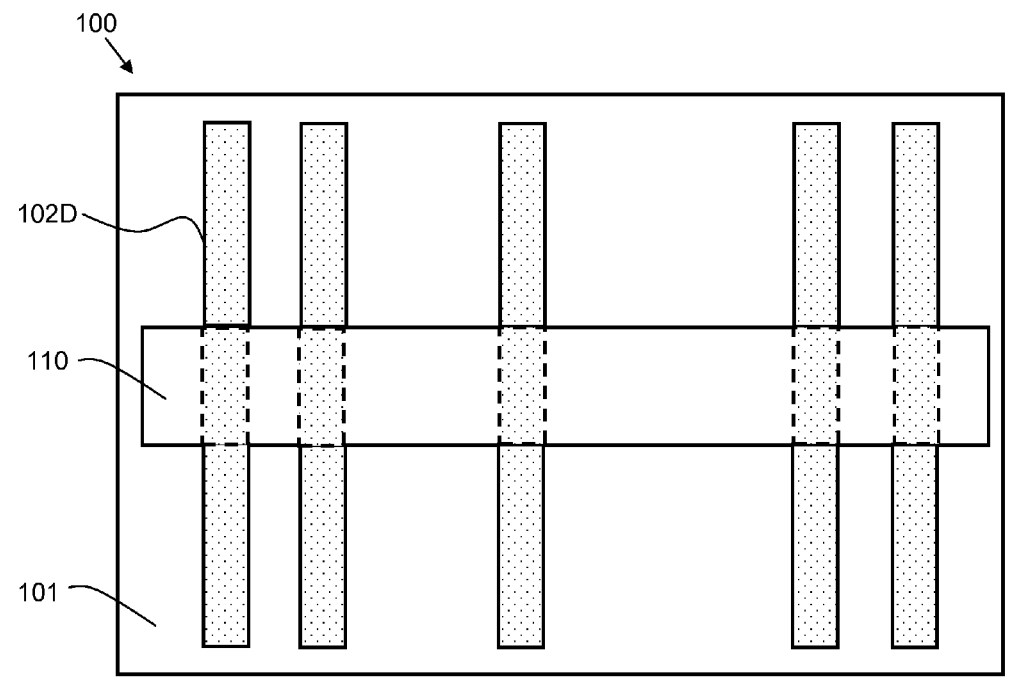

FIG. 1D shows a top-down view of FinFET structure 100 after removal of a portion of the gate layer over the sides of the design fins 102D.

Figure 2A:
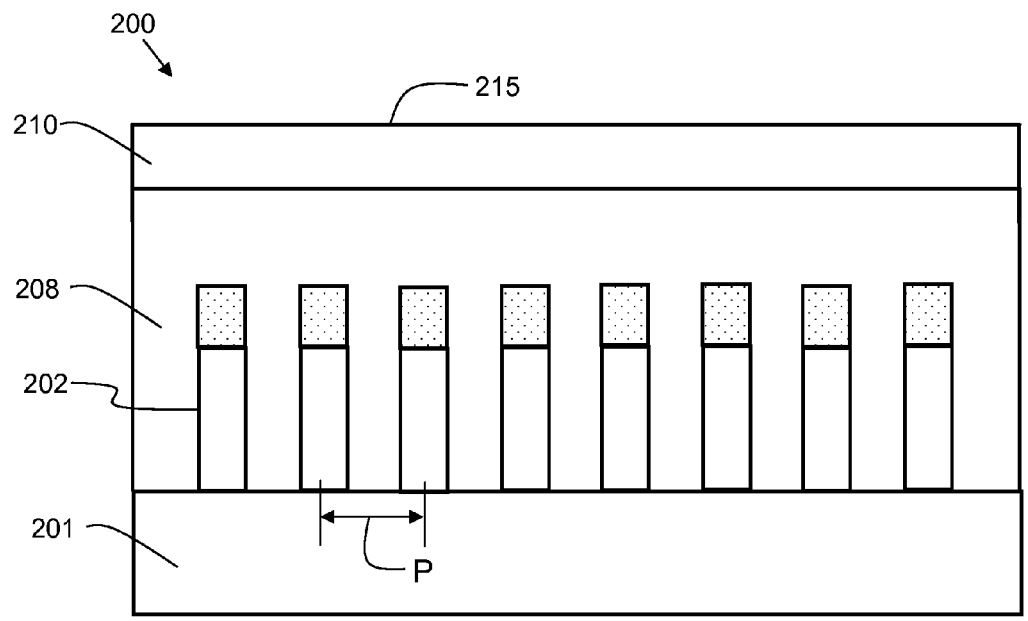

FIGS. 2A-2G show a FinFET fabrication process in accordance with an embodiment of the present invention. The starting point for this process is a FinFET structure such as that shown in FIG. 1A. As stated previously, often, similar elements may be referred to by similar numbers in various figures (FIGs) of the drawings, in which case typically the last two significant digits may be the same. For example, dielectric substrate 201 of FIG. 2A is similar to dielectric substrate 101 of FIG. 1A. In FIG. 2A, the gate layer 208 and gate hardmask layer 210 are disposed over the entire set of fins 202. This includes both design fins as well as sacrificial fins. Because no fins have been removed at this time, the gate layer 208 and hardmask layer 210 are of consistent height, and gate hardmask surface 215 is planar (compare with 115 of FIG. 1C). In one embodiment, gate layer 208 is comprised of polysilicon and gate hardmask layer 210 is a nitride layer. In another embodiment, the gate layer 208 is comprised of tungsten. In another embodiment, the hardmask layer 210 is comprised of oxide. In yet another embodiment, the hardmask layer 210 is comprised of silicon carbide. In one embodiment, the pitch P of the fin pattern is fixed at a value in the range of about 20 nanometers to about 60 nanometers.

Figure 2B:
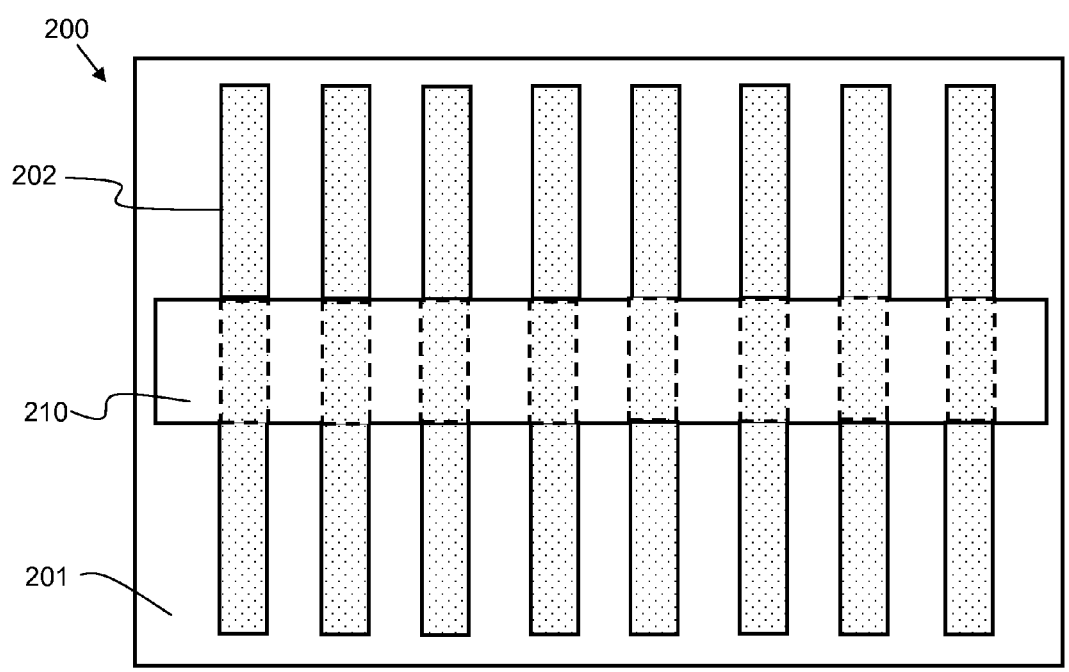

FIG. 2B shows a top-down view of FinFET structure 200 after removal of a portion of the gate layer over the sides of the fins 202.

Figure 2C:
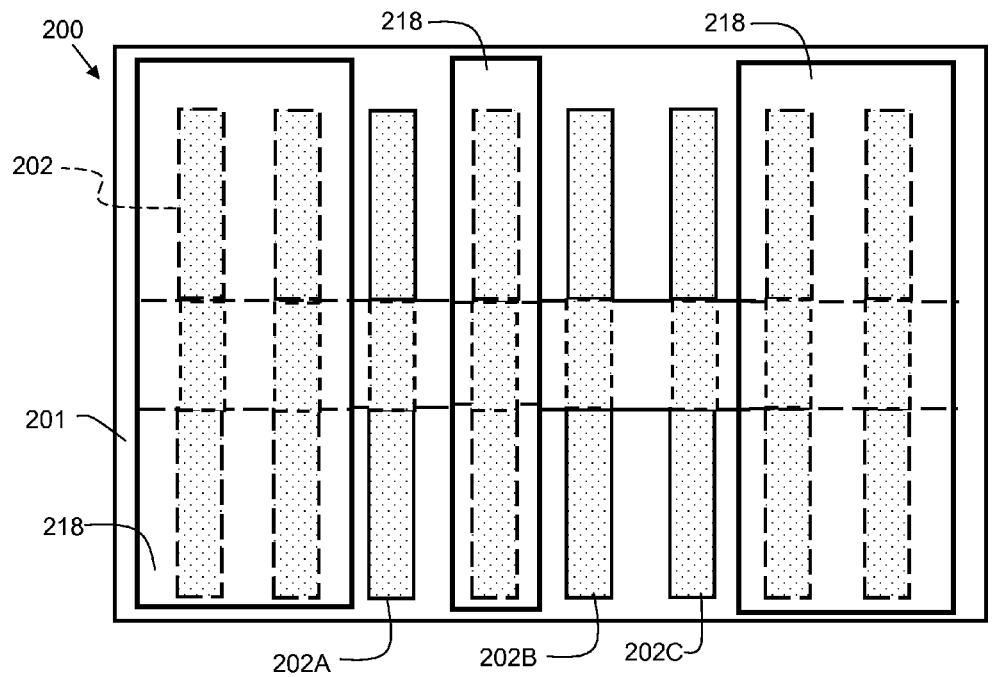

FIG. 2C shows a top-down view of FinFET structure 200 after a subsequent step in the fabrication process, where an etch-resistant layer 218 is disposed over the design fins, whereas the sacrificial fins (202A, 202B, and 202C) are left uncovered. In one embodiment, the etch-resistant layer is comprised of carbon. In another embodiment, the etch-resistant layer is comprised of photoresist. In another embodiment, the etch-resistant layer is comprised of a silicon-containing organic layer.

Figure 2D:
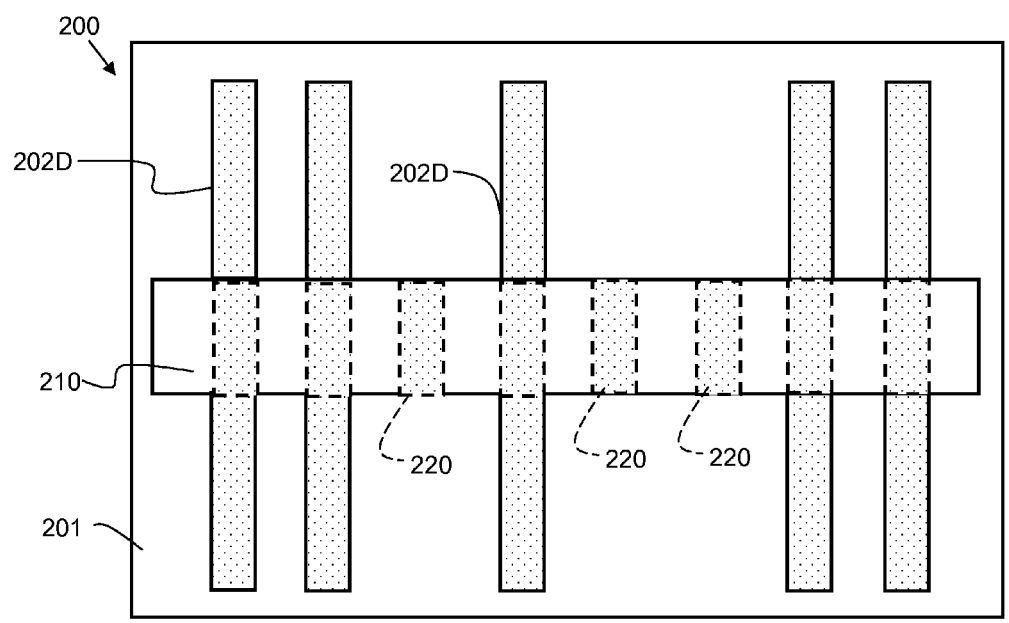

FIG. 2D shows a top-down view of FinFET structure 200 after removal of the sacrificial fins (202A, 202B, and 202C of FIG. 2C), and then removal of the etch-resistant layer (218 of FIG. 2C). A portion of the sacrificial fins (referred to as a "finlet") remains under the gate. The sacrificial fins may be removed with a wet etch process or a dry etch process.

Figure 2E:
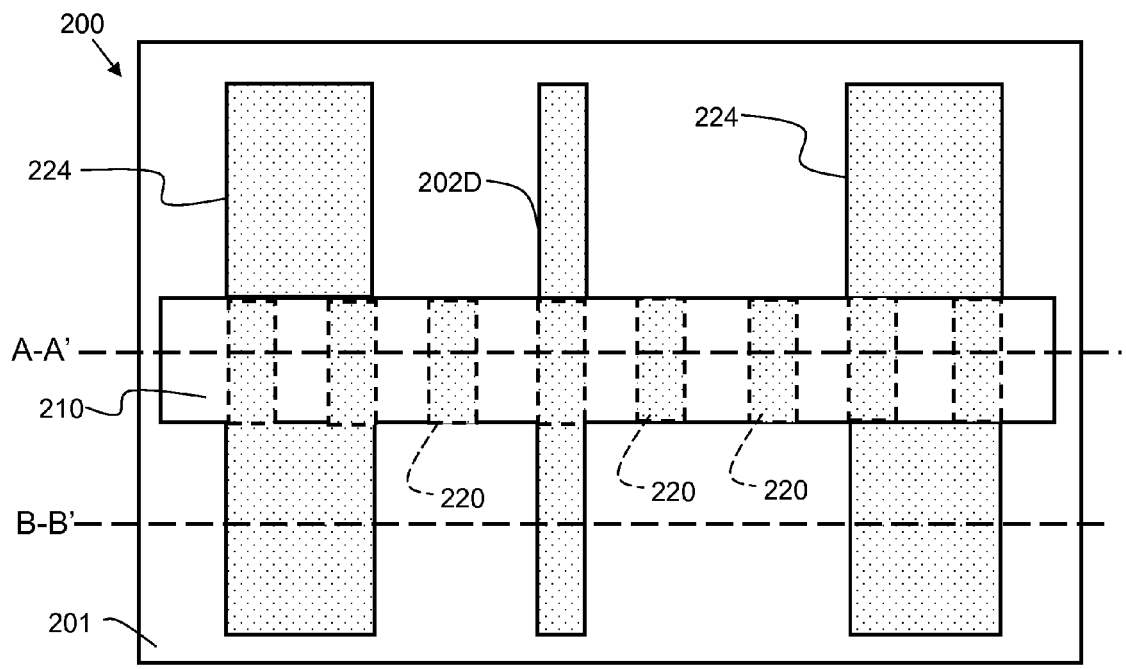

FIG. 2E shows a top-down view of FinFET structure 200 after merging of some of the design fins. In most practical cases, the merging of the fins would take place after an offset spacer formation on the gate (not shown), for example a nitride spacer. Merging fins comprises causing neighboring fins to contact each other. The merged fins 224 are uses in certain instances to provide a larger surface area for contacts. The merging process may be performed by epitaxial growth.

In some cases, not all of the design fins may be merged. In some embodiments, at least two design fins are merged.

Figure 2F:
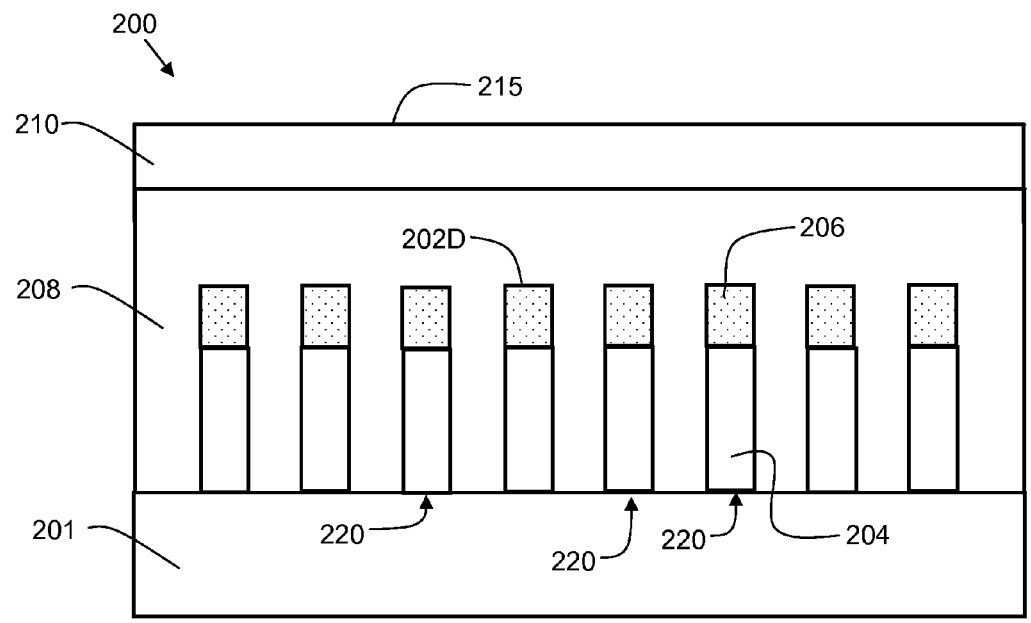

FIG. 2F is a cross-sectional view of the of FinFET structure 200 shown along line A-A' (inside the gate) in FIG. 2E. In this view, it can be seen that each finlet 220 is comprised of silicon portion 204 with a fin hardmask portion 206 disposed thereon. In one embodiment, the fin hardmask portion 206 is comprised of silicon nitride, silicon carbide, TiN, TaN, or amorphous carbon.

Figure 2G:
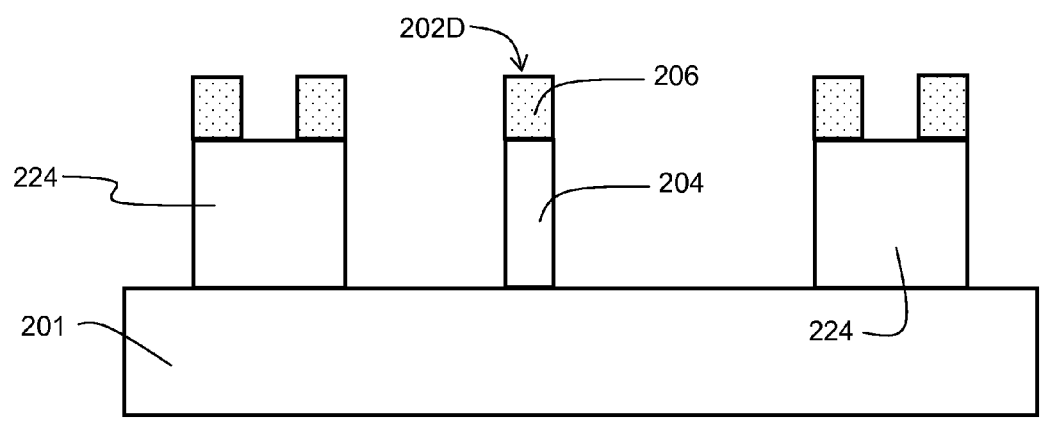

FIG. 2G is a cross-sectional view of the of FinFET structure 200 shown along line B-B' (outside the gate) in FIG. 2E. In this view, only the design fins (merged fins 224 and single design fin 202D) remain. Note that while FIG. 2G shows the design fins as comprising a silicon portion 204 and fin hardmask portion 206, it is possible that in some embodiments, the fin hardmask portion 206 is completely removed in the B-B' cross section.

Figure 3A:
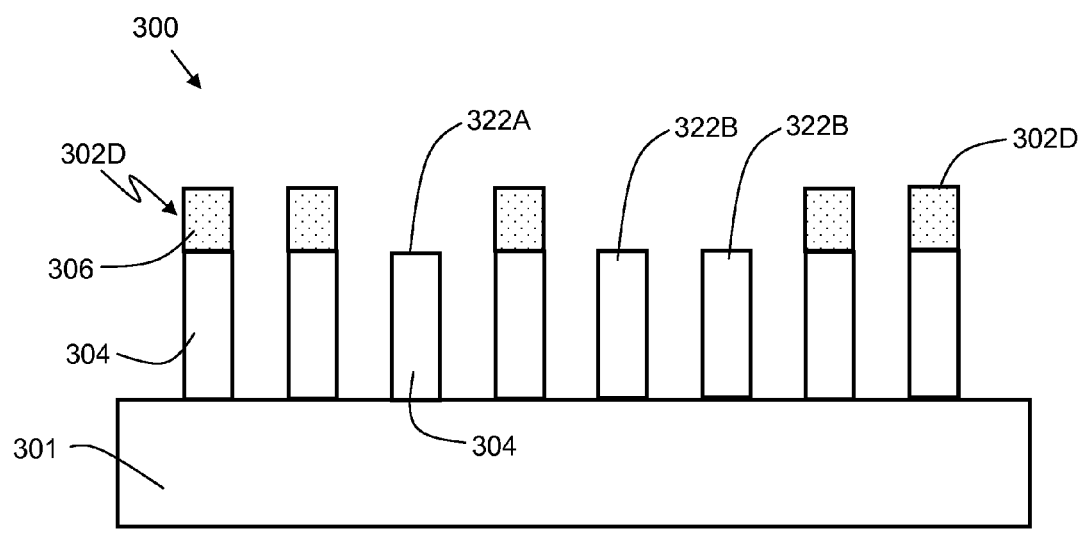
Figure 3B:
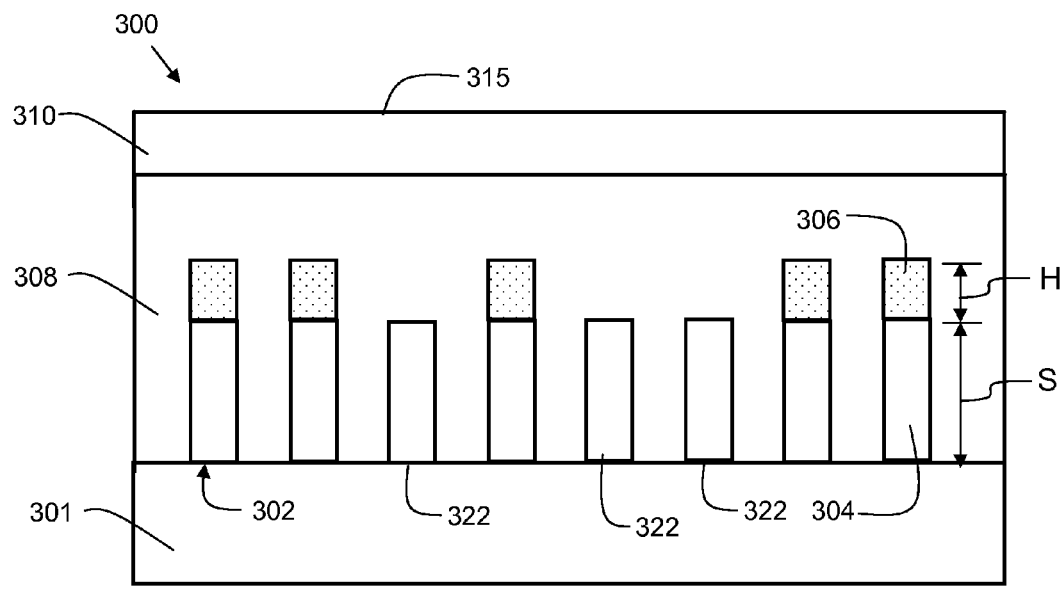
Figure 3C:
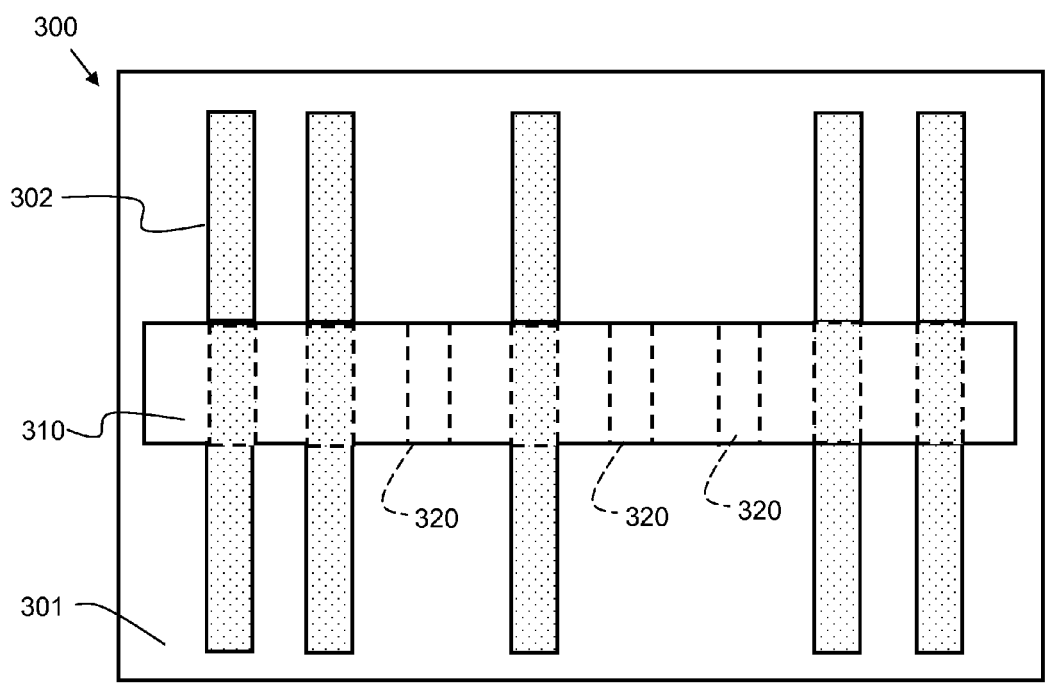

FIGS. 3A-3C show a FinFET fabrication process in accordance with an alternative embodiment of the present invention. The starting point for this process is a FinFET structure such as that shown in FIG. 1A. In FIG. 3A, the design fins (shown generally as 302D) comprise a silicon portion 304 and a fin hardmask portion 306 disposed over the silicon portion 304. In one embodiment, the fin hardmask portion 306 has a thickness in the range of about 2 nanometers to about 20 nanometers. The sacrificial fins (322A, 322B, and 322C) have the fin hardmask portion removed, and hence, consist of silicon portion 304.

In FIG. 3B, the gate layer 308 and gate hardmask layer 310 are disposed over the entire set of fins, which includes both design fins 302, and sacrificial fins 322. This embodiment is more effective when the thickness H of the fin hardmask portion is small in comparison to the thickness S of the fin silicon portion 304. In one embodiment, the ratio of H/S is between about 0.05 and about 0.125. In this way, the top surface 315 of gate hardmask layer 310 is still substantially planar.

FIG. 3C shows a top-down view of FinFET structure 300 after removal of a portion of the gate layer over the sides of the fins 302. This step also removes the sacrificial fins (322 of FIG. 3B) leaving finlets 320. Unlike finlets 220 of FIG. 2F, finlets 320 do not have a fin hardmask portion (such as 206 of FIG. 2F), and consist only of a silicon portion. From this point forward, the design fins may be merged as needed, and industry standard techniques may be used to complete the FinFET from this point. This embodiment eliminates the need for the etch-resistant layer (218 of FIG. 2C).

Figure 4:
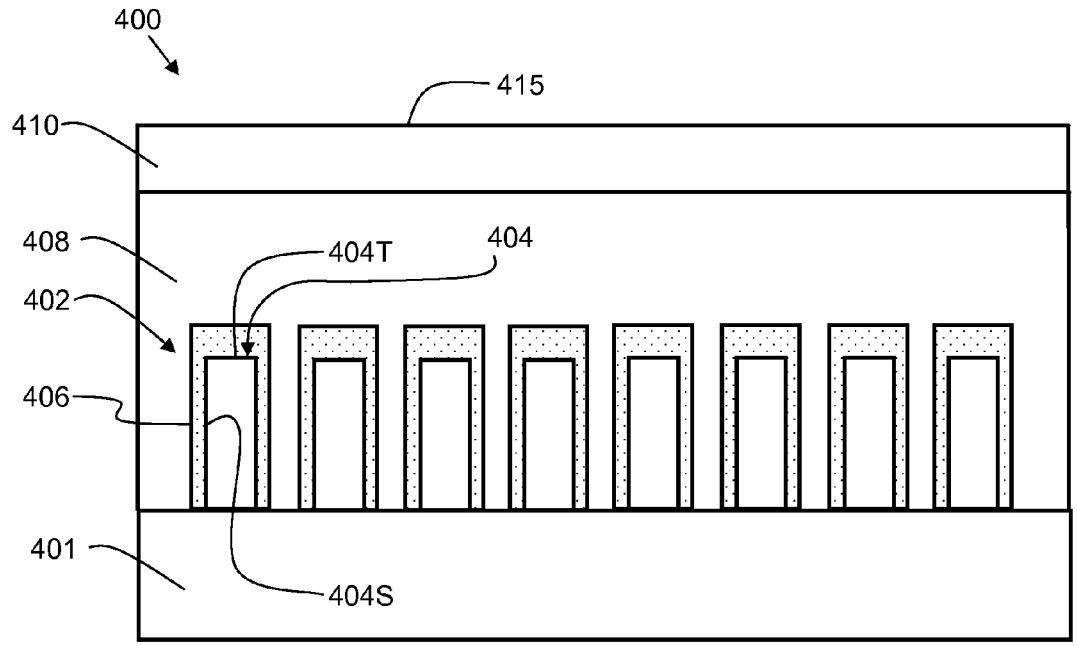

FIG. 4 shows a step in a FinFET fabrication process in accordance with another embodiment of the present invention. In this case, FinFET structure 400 is comprised of fins 402, each of which has a silicon portion 404, and a conformal protective film 406 disposed thereon. Conformal protective film 406 covers both the top 404T of silicon portion 404 as well as the sides 404S of silicon portion 404. In one embodiment, the conformal protective film 406 is comprised of one of: silicon nitride, silicon carbide, TiN, and TaN. The methods described for FIGS. 2A-2F and FIGS. 3A-3C may be performed using the FinFET structure 400.

Figure 5:
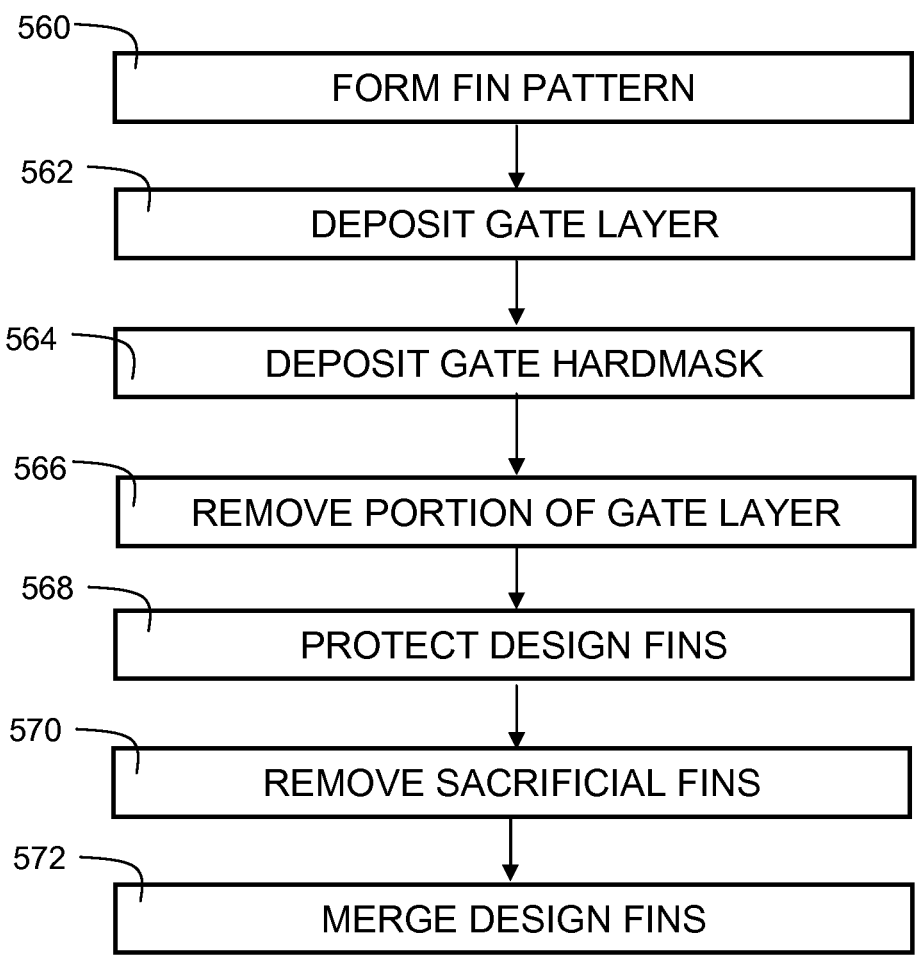

FIG. 5 is a flowchart indicating process steps for a FinFET fabrication process in accordance with an embodiment of the present invention. In process step 560, a fin pattern is formed. In process step 562, a gate layer is deposited (see 208 of FIG. 2A). In process step 564, a gate hardmask is deposited (see 210 of FIG. 2A). In process step 566, a portion of the gate layer is removed (see FIG. 2B). In process step 568, the design fins are protected with an etch-resistant layer (see 218 of FIG. 2C). In process step 570, sacrificial fins are removed (see FIG. 2D). In process step 572, some of the design fins are merged (see 224 of FIG. 2E).

Figure 6:
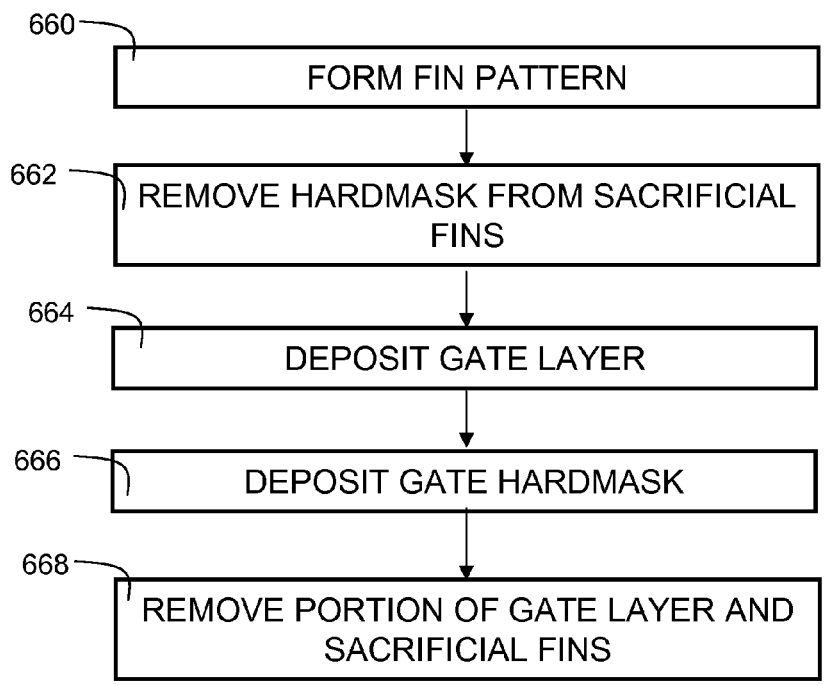

FIG. 6 is a flowchart indicating process steps for a FinFET fabrication process in accordance with an alternative embodiment of the present invention. In process step 660, a fin pattern is formed. In process step 662, the fin hardmask is removed from sacrificial fins (see 322A of FIG. 3A). The removal of the fin hardmask may be done with a combination of lithographic and/or etch processes. In process step 664, a gate layer is deposited (see 308 of FIG. 3B). In process step 666, a gate hardmask layer is deposited (see 310 of FIG. 3B). In process step 668, a portion of the gate layer is removed along with the sacrificial fins (see FIG. 3C). The removal of the gate portion and the sacrificial fins is accomplished in a single process step because the hardmask was previously removed from the sacrificial fins. Hence, the same process that removes the gate layer (silicon) also removes the silicon of the sacrificial fins.

Figure 7:
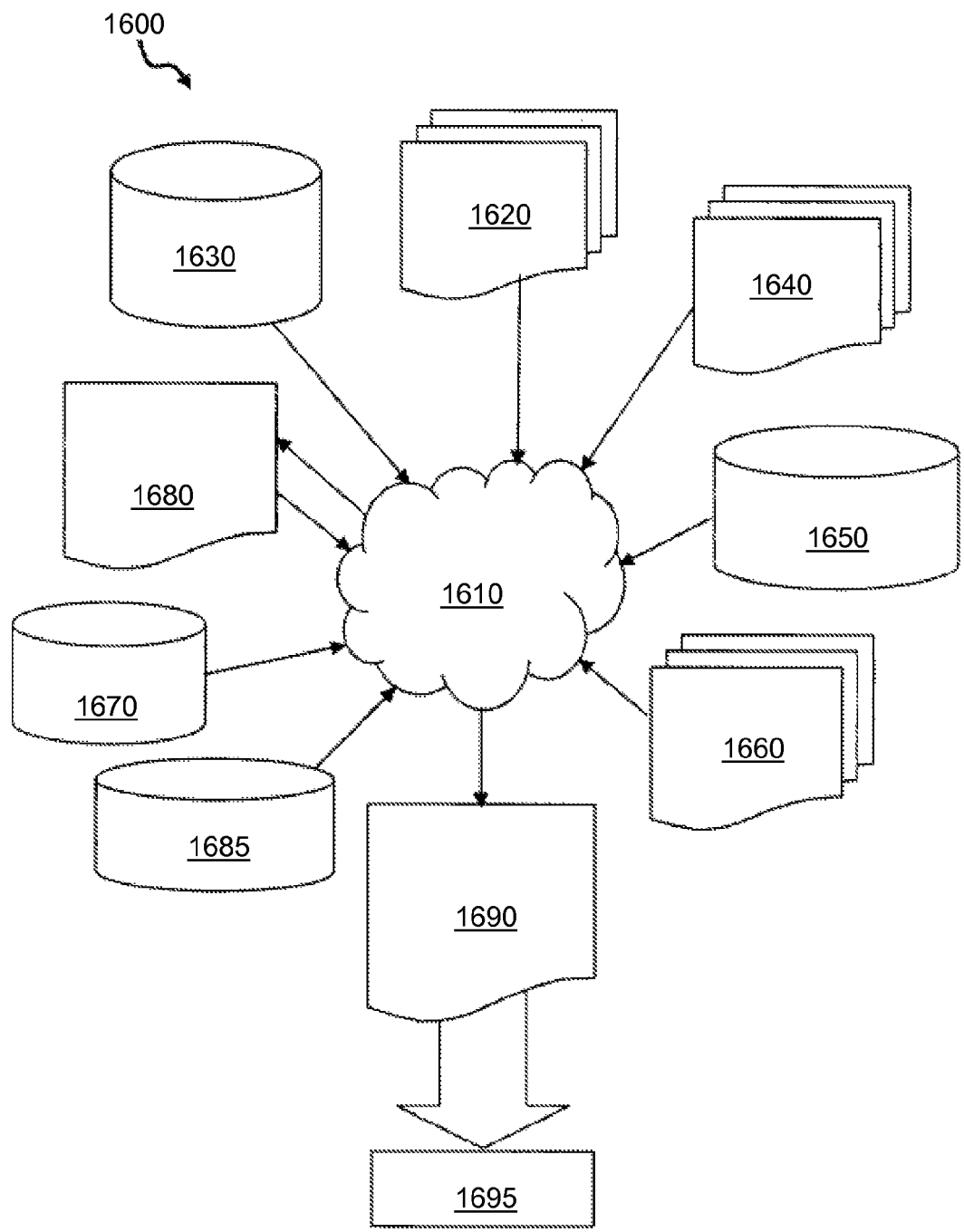

FIG. 7 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 2-4. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 2-4. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 2-4 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 2-4, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 2-4. Design structure 1690 may then proceed to a stage 1695 where, for example, design structure 1690: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a FinFET, comprising:
   forming a pattern of fins, wherein each fin comprises a fin hardmask layer disposed thereon;
   depositing a gate layer over the pattern of fins;
   depositing a gate hardmask layer over the gate layer;
   removing a portion of the gate hardmask layer and the gate layer, thereby exposing the pattern of fins;
   depositing an etch-resistant layer over a first subset of fins from the pattern of fins;
   removing a second subset of the fins from the pattern of fins with an etch; and
   merging at least some of the first subset of fins.

2. The method of claim 1, wherein depositing an etch-resistant layer over a first subset of the fins comprises depositing a layer comprising carbon.

3. The method of claim 1, wherein depositing an etch-resistant layer over a first subset of the fins comprises depositing a layer comprising photoresist.

4. The method of claim 1, wherein forming a pattern of fins comprises forming a pattern of fins with a pitch ranging from about 20 nanometers to about 60 nanometers.

5. The method of claim 1, wherein removing a second subset of the fins further includes a wet etch.

6. The method of claim 1, wherein removing a second subset of the fins further includes a dry etch.

7. The method of claim 1, wherein forming a pattern of fins further includes depositing a hardmask comprised of a material selected from the group consisting of:
   silicon oxide, silicon nitride, silicon carbide, TiN, TaN, and amorphous carbon.

8. The method of claim 1, wherein forming a pattern of fins further includes depositing a conformal film of a material selected from the group consisting of:
   silicon nitride, silicon carbide, TiN, TaN, and amorphous carbon.

9. A method of fabricating a FinFET, comprising:
   forming a pattern of fins, wherein each fin comprises a fin hardmask layer disposed thereon;
   removing the fin hardmask layer from a first subset of fins from the pattern of fins;
   depositing a gate layer over the pattern of fins;
   depositing a gate hardmask layer over the gate layer;
   removing a portion of the gate hardmask layer;
   removing a portion of the gate layer and the first subset of fins in a single process step, wherein a second subset of fins from the pattern of fins is preserved.

10. The method of claim 9, further comprising merging at least two fins from the second subset of fins.

11. The method of claim 9, wherein forming a pattern of fins comprises forming a pattern of fins with a pitch ranging from about 20 nanometers to about 60 nanometers.

12. The method of claim 9, wherein forming a pattern of fins further includes depositing a hardmask comprised of a material selected from the group consisting of:
   silicon oxide, silicon nitride, silicon carbide, TiN, TaN, and amorphous carbon.

13. The method of claim 9, wherein forming a pattern of fins further includes depositing a conformal film comprised of a material selected from the group consisting of:
   silicon nitride, silicon carbide, TiN, TaN, and amorphous carbon.

14. The method of claim 12, wherein depositing a hardmask of oxide comprises depositing a hardmask layer with a thickness in the range of about 2 nanometers to about 20 nanometers.

15. The method of claim 9, wherein forming a pattern of fins further includes forming a pattern of fins with a ratio of hardmask thickness to silicon thickness ranging from about 0.05 to about 0.125.

* * * * *